US009990463B2

(12) United States Patent
Bullara et al.

(10) Patent No.: US 9,990,463 B2
(45) Date of Patent: Jun. 5, 2018

(54) SYSTEM FOR AUTOMATED DESIGN OF MULTI-BODY MACHINE

(71) Applicant: Solar Turbines Incorporated, San Diego, CA (US)

(72) Inventors: Paul Richard Bullara, Carlsbad, CA (US); Doru Catalin Dosianu, San Diego, CA (US); Jonathan Perdue Windt, San Diego, CA (US)

(73) Assignee: Solar Turbines Incorporated, San Diego, CA (US)

(*) Notice: Subject to any disclaimer, the term of this patent is extended or adjusted under 35 U.S.C. 154(b) by 324 days.

(21) Appl. No.: 14/835,160

(22) Filed: Aug. 25, 2015

(65) Prior Publication Data

US 2015/0363545 A1 Dec. 17, 2015

Related U.S. Application Data

(63) Continuation-in-part of application No. 13/691,009, filed on Nov. 30, 2012, now abandoned.

(51) Int. Cl.
*G06F 19/00* (2018.01)
*G06F 17/50* (2006.01)

(52) U.S. Cl.
CPC ................. *G06F 17/5086* (2013.01)

(58) Field of Classification Search
CPC combination set(s) only.
See application file for complete search history.

(56) References Cited

U.S. PATENT DOCUMENTS

| 4,931,929 A | 6/1990 | Sherman |
| 5,689,435 A | 11/1997 | Umney et al. |
| 6,108,662 A * | 8/2000 | Hoskins ................. G06Q 10/06 700/95 |
| 6,594,535 B1 * | 7/2003 | Costanza ......... G05B 19/41865 700/97 |
| 6,983,236 B1 | 1/2006 | Karlovac et al. |

(Continued)

FOREIGN PATENT DOCUMENTS

WO WO 99/60497 11/1999

OTHER PUBLICATIONS

"Flow Forces Analysis of an Open Center Hydraulic Directional Control Valve Sliding Spool" by R. Amirante et al., *Energy Conversion and Management* Journal (2006).

*Primary Examiner* — Kidest Bahta
(74) *Attorney, Agent, or Firm* — Finnegan, Henderson, Farabow, Garrett & Dunner, LLP

(57) ABSTRACT

A system for automated design of a machine having multiple driven bodies is disclosed. The system may have a multi-body database with at least one of a parts section and a launch code section. The system may also have one or more processors configured to cause a listing of components selectable for inclusion within a machine to be shown on a display device, and to receive a selection of an input component and the multiple driven bodies from the listing via an input device. The processors may also be configured to retrieve data regarding the selected input component and the multiple driven bodies from the at least one of the parts section and the launch code section, and to generate a design for at least one new support component in the machine based on the input component, the multiple driven bodies, and the data.

22 Claims, 8 Drawing Sheets

(56) References Cited

U.S. PATENT DOCUMENTS

| | | |
|---|---|---|
| 7,263,674 B2 | 8/2007 | Lorenz |
| 7,383,167 B2 | 6/2008 | Oke |
| 7,991,598 B1 | 8/2011 | Wood |
| 8,503,336 B2 * | 8/2013 | Rappaport ............ H04L 41/145 370/252 |
| 2006/0100934 A1 | 5/2006 | Burr et al. |
| 2011/0098837 A1 * | 4/2011 | Yucel .................. G06F 17/5086 700/104 |
| 2014/0156242 A1 | 6/2014 | Bullara et al. |

* cited by examiner

SYSTEM FOR AUTOMATED DESIGN OF MULTI-BODY MACHINE

RELATED APPLICATIONS

This patent application is a continuation-in-part of co-pending U.S. patent application Ser. No. 13/691,009 filed on Nov. 30, 2012, the contents of which are expressly incorporated herein by reference.

TECHNICAL FIELD

The present disclosure relates generally to an automated design system, and more particularly, to a system for automated design of a multi-body machine.

BACKGROUND

Different customers use machine systems with different component configurations depending on intended applications for the systems. For example, one customer may select a first input component (e.g., an engine) having a particular size, speed, capacity, and/or cost to drive one or more output components (e.g., compressors). If multiple output components are driven by the engine, the output components may be connected to each other and/or to the engine by way of a gearbox. The compressors can be the same or different, with the sizes, speeds, capacities, and/or costs to achieve a particular goal (e.g., efficiency, emissions, fuel consumption, packaging, budgetary, etc.). A second customer, however, may select a second input component to drive the one or more different components by way of the same or a different gear box in order to achieve a second goal.

While customization of machine system configurations can be beneficial for the customer, it also creates significant work for the manufacturer of the machine systems. In particular, each machine system configuration can require hundreds or even thousands of hours of engineering work to design support components (e.g., platforms, pedestals, grating, fluid circuitry, etc.) required to interconnect the different components selected by the customer. In some situations, this extra work may be worthwhile, as long as the new system configuration is requested in large number by the customer. In other situations, however, the extra design work may reduce profitability of the new configuration.

SUMMARY

In one aspect, the present disclosure is directed to a system for automated design of a machine having multiple driven bodies. The system may include a multi-body database having at least one of a parts section and a launch code section, a display device, and an input device. The system may also include one or more processors in communication with the multi-body database, the display device, and the input device. The one or more processors may be configured to cause a listing of components selectable for inclusion within a machine to be shown on the display device, and to receive a selection of an input component and the multiple driven bodies from the listing via the input device. The one or more processors may also be configured to retrieve data regarding the selected input component and the multiple driven bodies from the at least one of the parts section and the launch codes section, and to generate a design for at least one new support component in the machine based on the input component, the multiple driven bodies, and the data.

In another aspect, the present disclosure is directed to a method for automatically designing a machine having multiple driven bodies. The method may include displaying a listing of components selectable for inclusion within a machine, and receiving a selection of an input component and the multiple driven bodies from the listing. The method may also include retrieving data regarding the input component and the multiple driven bodies from a multi-body database having at least one of a parts section and a launch code section, and automatically generating a design for at least one new support component in the machine based on the input component, the multiple driven bodies, and the data.

DETAILED DESCRIPTION

The disclosed methods and systems are explained below in relation to a specific machine having input and output modules. The input and output modules are shown and described as being gas turbine and compressor modules, respectively. It should be noted, however, that other and different modules and/or machines may similarly be designed with the disclosed methods and systems, if desired. Accordingly, the machine, input module, and output modules should be considered exemplary only.

Figure 1:
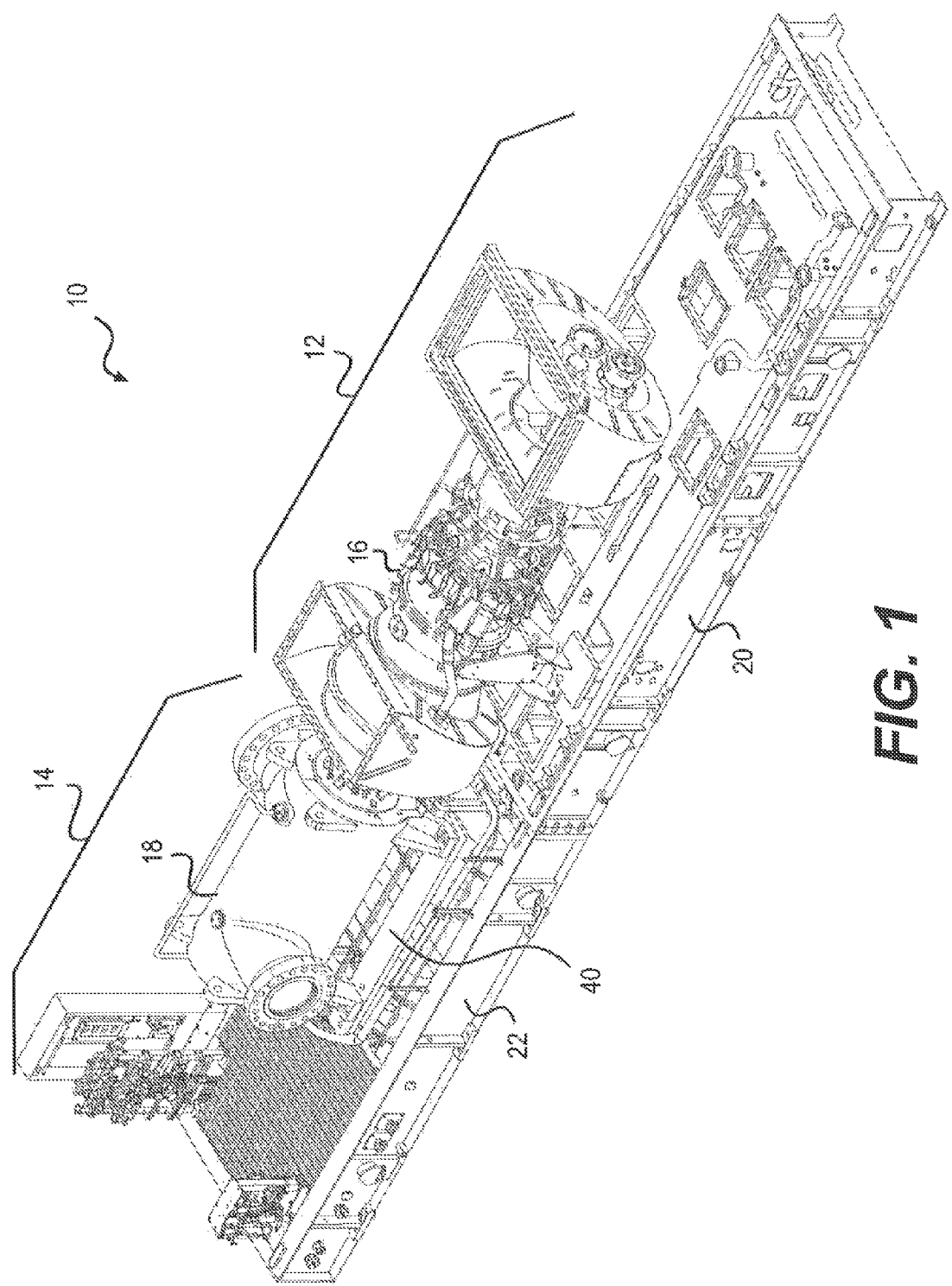
FIG. 1 is a perspective view illustration of an exemplary disclosed single-body machine.

FIG. 1 illustrates an exemplary machine 10 having an input component 12 operatively coupled to an output component 14. In the disclosed embodiment, machine 10 is a gas turbine-powered compressor system. In this embodiment, input component 12 is a gas turbine module and output component 14 is a compressor module connectable to be driven by the gas turbine module. As a gas turbine module, input component 12 includes a gas turbine engine 16 that is configured to receive a mixture of air and fuel, combust the mixture, and produce a mechanical output rotation. The mechanical output rotation is then directed to the compressor module to drive a compressor 18 of the module and compress a gas. The gas may include, for example, air, natural gas, or another gas known in the art.

Engine 16 of the gas turbine module may be mounted to a platform 20, and the gas turbine module may further include all support components necessary to run the engine. For example, the gas turbine module may include all the hardware required to mechanically connect engine 16 to platform 20. The gas turbine module may also include components associated with a fuel system, an air induction system, an exhaust system, a lubrication system, a cooling system, a control system, etc. The gas turbine module may be configured to be easily transportable and connectable to a variety of different compressor modules. It is contemplated that the gas turbine module may be packaged and sold independent of the compressor module or, alternatively, packaged and sold together with the compressor module as a single machine 10.

The depicted gas turbine module may be representative of a variety of available modules that are selectable by a customer and/or other user (e.g., the manufacturer) for inclusion within a particular machine 10. For example, the customer may be able to select for packaging and purchasing any number of gas turbine modules that differ in a variety of ways. The different gas turbine modules may range in size, speed, power, emissions, noise, fuel, cost, and/or in other ways known in the art. Each gas turbine module may include a different gas turbine engine 16, a different platform 20, a different fuel system, a different air system, a different lubrication system, a different exhaust system, a different cooling system, and/or different hardware that connects the components of the module together.

Compressor 18 of the compressor module may also be mounted to a platform 22 and the module may further include all support components necessary to facilitate operation of compressor 18. For example, the compressor module may include all the hardware required to mechanically connect compressor 18 to platform 22. The compressor module may also include components associated with a gas induction system, a gas discharge system, a lubrication system, a cooling system, a control system, etc. The compressor module may be configured to be easily transportable and connectable to variety of different gas turbine modules. It is contemplated that the compressor module may be packaged and sold independent of the gas turbine module, or alternatively packaged and sold together with the gas turbine module as a single machine.

The depicted compressor module may be representative of a variety of available compressor modules that are selectable by the customer for inclusion within a particular machine 10. For example, the customer may select for packaging and purchasing any number of compressor modules that differ in a variety of ways. The different compressor modules may range in size, speed, power, noise, cost, and in other ways known in the art. Each compressor module may include a different compressor 18, a different platform 22, a different lubrication system, a different cooling system, a different induction system, a different discharge system, and/or different hardware that connects the components of the module together.

In some applications, the customer may be able to select any existing gas turbine module for connection to any existing compressor module. In other applications, the customer may be able to select particular components within one or both of the gas turbine and compressor modules. For example, the customer may be able to select a particular gas turbine engine 16, a particular compressor 18, a particular fuel system, a particular platform 20, 22, or another particular component or system within one or both of the gas turbine and compressor modules. In some situations, the configuration of components selected by the customer may have already been designed and compiled within an existing module and, thus, ready for manufacture. In other situations, however, the configuration of components selected by the customer may be new. In these situations, design work may be required before the gas turbine and/or compressor modules are made available for purchase by the customer.

Figure 2:
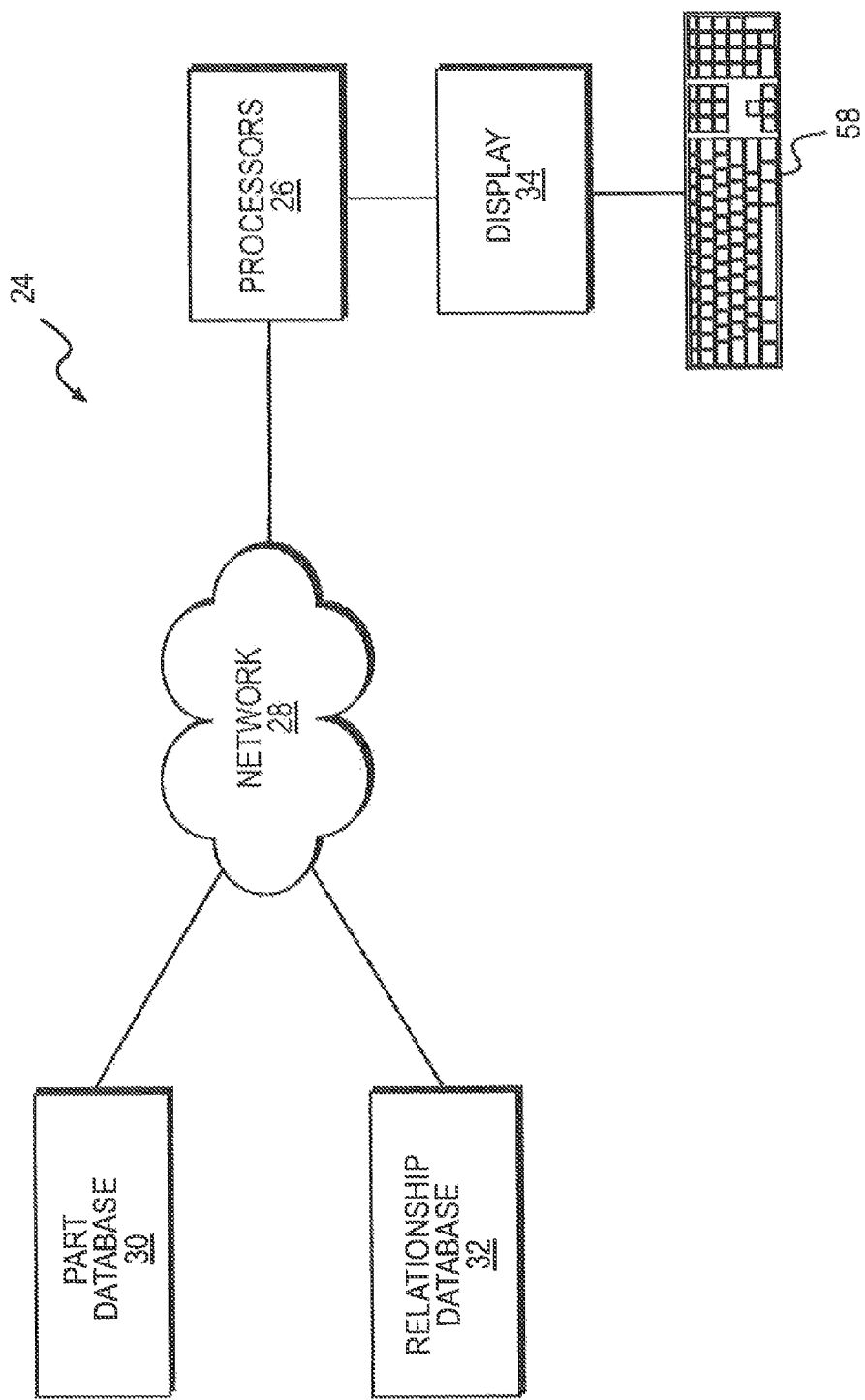
FIG. 2 is a diagrammatic illustration of an exemplary disclosed design system that may be used to automatically design the machine of FIG. 1.

FIG. 2, illustrates an exemplary disclosed system 24 used to automatically generate designs for the gas turbine and/or compressor modules having new configurations selected by the customer. System 24 may include one or more computer processors (or other hardware) 26 and software applications (or other software) executable by processor(s) 26 to perform certain functions related to module design. These functions may include, but are not limited to, generating, maintaining, updating, deleting, rendering, analyzing, and/or presenting different design configurations of machine 10 (referring to FIG. 1).

Processor(s) 26 may be connected, e.g., via a network 28, to one or more databases. These databases may include, among others, a part database 30 that contains dimensional information regarding the different components within each of the gas turbine and compressor modules that are selectable by the customer, and a relationship database 32 that contains information relating changes in particular components to changes in other support components within the same machine 10. Network 28 may be any type of wired or wireless communication network for exchanging or delivering information or signals, such as the internet, a wireless local area network (LAN), or any other network. Thus, network 28 may be any type of communications system known in the art.

Processor(s) 26 may have an integral memory or otherwise be connected to an external memory (not shown), a transceiver device (not shown), and a display device 34. Display device 34 may include one or more monitors (e.g., a liquid crystal display (LCD), a cathode ray tube (CRT), a personal digital assistant (PDA), a plasma display, a touchscreen, a portable hand-held device, or any such display device known in the art) configured to actively and responsively display information to a user of system 24, such as a designer, the customer, or any other entity.

The transceiver device may include one or more devices that transmit and receive data, such as data processed by processor(s) 26 and/or stored by the memory. The memory may be configured to store information used by processor(s) 26, e.g., computer programs or code used by processor(s) 26 to enable processor(s) 26 to perform functions consistent with this disclosure. The memory may include one or more memory devices including, hut not limited to a storage medium such as a read-only memory (ROM), a flash memory, a dynamic or static random access memory (RAM), a hard disk device, an optical disk device, etc.

Processor(s) 26 may be configured to receive data (e.g., from the databases listed above) and/or from a customer or user, and responsively process information stored in the memory. Processor(s) 26 may be configured with different types of hardware and/or software (e.g., a microprocessor, a gateway, a product link device, a communication adapter, etc.). Further, processor(s) 26 may execute software for performing one or more functions consistent with the disclosed embodiments. Processor(s) 26 may include any appropriate type of general purpose microprocessor, digital signal processor, or microcontroller.

Part database 30 may include data regarding critical packaging information associated with each customer-selectable component. For example, the data may include identification of a particular component (e.g., by name and/or by serial number), and a listing of dimensions that should be accommodated by the associated module to properly package the component within the module.

For example, with regard to FIG. 1, gas turbine engine 16 may have critical dimensions associated with a length; a width; a height; a weight; a location of mounting brackets; a location of air inlet ducts; a location of fuel inlet conduits; a location of exhaust outlets; a required size of the ducts, the conduits, and the outlets; etc. Likewise, compressor 18 may also have similar critical dimensions associated with its length, its width, its height, its weight, its location of mounting brackets, its location of gas inlet ducts, its location of gas discharge ducts, sizes of the associated ducts and conduits, etc. Accordingly, part database 30 may include an identification of a particular gas turbine engine 16, along with a listing of the dimensions critical to that particular gas turbine engine 16. Similarly, part database 30 may also include an identification of a particular compressor 18, along with a listing of the dimensions critical to that particular compressor 18. In the disclosed example, part database 30 includes families of multiple different gas turbine engines 16, along with listings of each of the dimensions critical to each different gas turbine engine 16 in each family. Likewise, part database 30 includes families of different compressors 18, along with listings of each of the dimensions critical to each of the different compressors 18 in each family.

For the purposes of this disclosure, a critical dimension may be considered a dimension that is unique to a particular component and/or family of components that has a direct affect on mounting, packaging, routing, and/or supporting of the component and/or assembly that receives the component. For example, when a configuration of mounting brackets of one gas turbine engine 16 is different from the configuration of mounting brackets of another turbine engine, a spacing, size, and/or number of mounting holes within platform 20 that are configured to receive the mounting brackets must also change in order to receive each of the particular engines 16. Accordingly, the spacing, size, and/or number of the mounting brackets may be considered critical dimensions of gas turbine engine 16.

Figure 3:
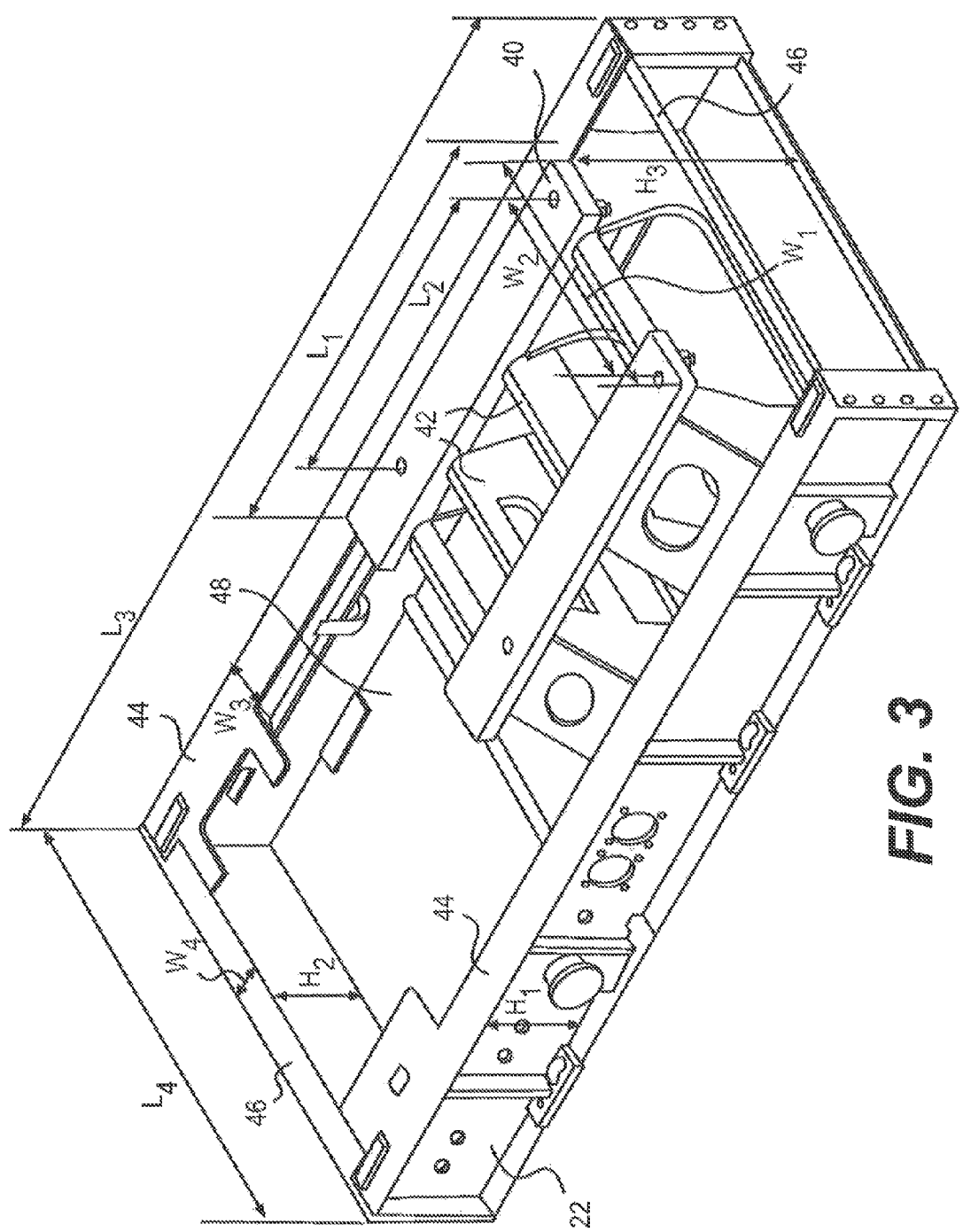
FIGS. 3-5 are pictorial illustrations of exemplary disclosed components of the machine illustrated in FIG. 1.
Figure 4:
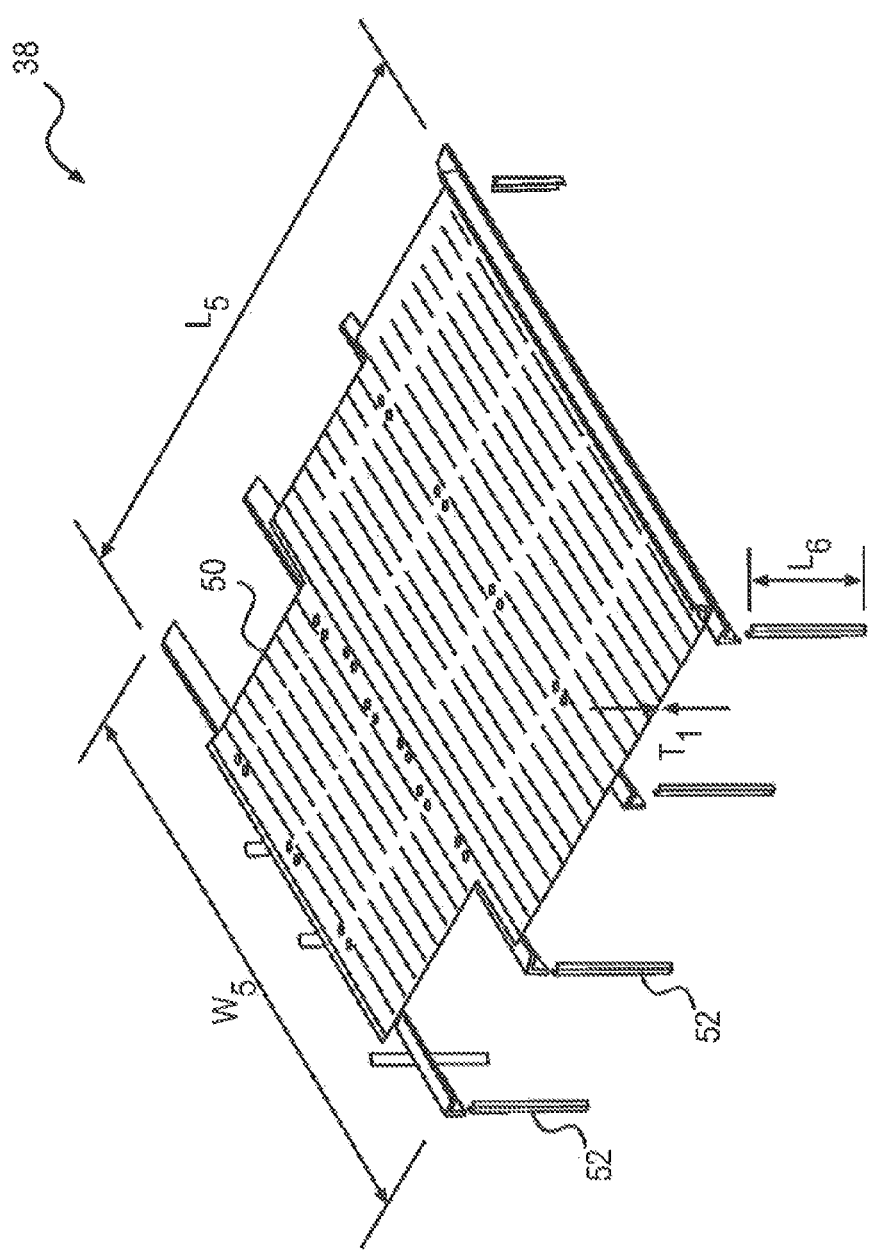
Figure 5:
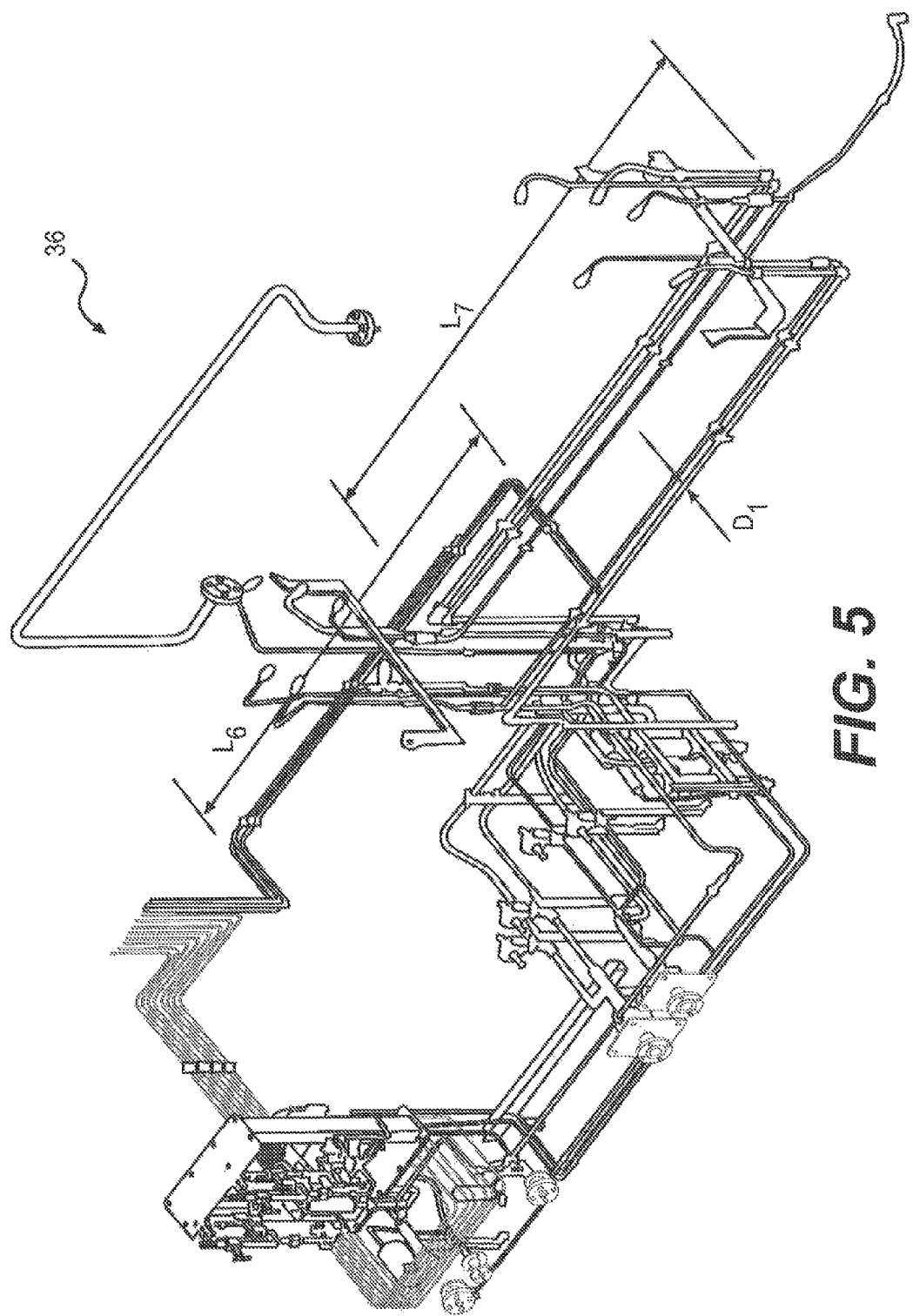

Part database 30 may also contain information relating to the support components in each of the gas turbine and compressor modules. For example, part database 30 may include data associated with fixed feature dimensions and variable feature dimensions for each non-selectable component of the gas turbine and compressor modules. As shown in FIGS. 3-5, the components may include, among others, fluid circuitry 36 (referring to FIG. 3) that facilitates fluid (e.g., lubricant, seal gas, coolant, air, fuel, etc.) flow to and from engine 16 and/or compressor 18; a grating group 38 (referring to FIG. 4) that provides a working stage on platforms 20, 22; subcomponents of platforms 20 and 22; and pedestals 40 used to mount engine 16 and/or compressor 18 to platforms 20, 22. The fixed feature dimensions may be dimensions that remain substantially the same regardless of the particular configuration selected by the customer. The variable feature dimensions, however, are dimensions that can change to accommodate different configurations of machine 10.

FIGS. 3-5 illustrate exemplary components of machine 10 that may need to change in some manner to accommodate different configurations selected by a customer. In particular, FIG. 3 shows one instance of platform 22 having a first embodiment of pedestal 40. Depending on the particular engine 16 selected by the customer, pedestal 40 may need to change to properly accommodate mounting of compressor 18. For example, a length $L_1$ of pedestal 40 may need to stretch or shrink depending on the corresponding length of compressor 18 selected by the customer. Similarly, a width $W_1$ may need to stretch or shrink for the same reason. A length $L_2$ and a width $W_2$ may also or alternatively need to change to accommodate differences in mounting bracket sizes and/or locations associated with the selected engine 16 and/or compressor 18. Similarly, a height H3 of pedestal 40 may need to stretch or shrink depending on the corresponding heights of engine 16 and compressor 18 selected by the customer. Additionally or alternatively, as the overall dimensions of pedestal 40 change to accommodate one particular compressor 18, a number of supports 42 of pedestal 40 may need to increase or decrease. In like manner, platform 22 may need to increase a length $L_3$, width $W_3$, and/or height $H_1$ of side beams 44 and/or a length $L_4$, width $W_4$, and/or height $H_2$ of end beams 46 that form portions of platform 22. With these changes, corresponding changes to a base plate 48 may also be needed. Similar or additional changes may be necessitated within platform 20 based on the selection of a particular engine module. For example, in order to properly position the selected compressor 18 within the compressor module (e.g., axially, vertically, and/or transversely) relative to a selected engine 15 mounted within the selected gas turbine module, changes to the support components of the gas turbine module and/or the support components of the compressor module may be required.

FIG. 4 illustrates an exemplary grating group 38 having features that may need to be changed to accommodate a particular engine 16 and/or a particular compressor 18 that has been selected by a customer for packaging with machine 10. Specifically, grating group 38 may have components that cooperate to support an operator on top of platform 22. This support structure may need to avoid conflict with other components of machine 10, while still providing the required support. Accordingly, grating group 38 may have a size and/or shape that needs to vary based on the selected engine 16 and/or compressor 18. For example, grating group 38 may include framework components (e.g., metal bars, metal screens, perforated plates, etc.) 50, and a plurality of upright supports 52 that connect framework components 50 to platform 22. As a footprint of a selected engine 16 varies, the general outline of framework components 50 may likewise change, a length $L_5$ may change, a width $W_5$ may change, and/or a thickness $T_1$ may change. Similarly, a length $L_6$ of supports 52 and/or a number of supports 52 may change as framework components 50 change.

FIG. 5 illustrates an exemplary embodiment of fluid circuits 36 having features that may need to be changed to accommodate a particular engine 16 and/or a particular compressor 18 that has been selected by a customer for packaging with machine 10. Specifically, fluid circuits 36 may have components that cooperate to transport fluids between different locations on machine 10, such as between different ports (supply, return, test, relief, etc.) of engine 16 and offboard components (e.g., supply tanks, pumps, accumulators, etc.), between different portions of compressor 18 and other offboard components, and/or between engine 16 and compressor 18. For this reason, as different engines 16 and/or compressors 18 may have the same or a different number of ports in different locations (e.g., further apart, closer together, higher, and/or lower), the fluid circuits 36 that connect these different ports together may need to change some for different combinations of engines 16 and/or compressors 18. While the individual components of fluid circuits 36 may retain some of their original shapes, other dimensions of these components may vary. For example, particular passages may have a length $L_6$ that increases or decreases, while other passages may have a length $L_7$ that increases or decreases. Similarly, the same or different passages may have a diameter $D_1$ that increases or decreases to accommodate different flow rates, pressures, or fluids associated with different selected engines 16 and/or compressors 18. It may also be possible that additional or different types of passages may be required for different configurations of engines 16 and/or compressors 18.

It should be noted that the support components listed above (e.g., platforms 20, 22; fluid circuitry 36, grating group 38, pedestals 40, etc) are exemplary only. In particular, it may be possible for additional and/or different support components to be included within machine 10 and affected by customer selections of engine 16 and/or compressor 18, if desired. For example, driveshafts, gear boxes, wiring harnesses, pressure seals, and other components may need to change based on a particular selected configuration of machine 10.

In some embodiments, part database 30 may further contain information relating to modeling reference points associated with each fixed and/or each modifiable component within the gas turbine and/or compressor modules. For example, part database 30 may contain listings associated with each component that define a coordinate frame location and orientation, a required number and placement of reference datum planes and axis, directional information, etc, which is built off of capabilities of part database 30. Part database 30 may build a foundation relating to modeling reference points associated with each fixed and/or modifiable component within the gas turbine and/or compressor modules. This information, as will be described in more detail below, may aid in automated generation of module assemblies with a computer aided drafting environment.

Relationship database 32 may include data regarding how the critical packaging information associated with each customer-selectable component relates to critical packaging information associated with other components (both customer selectable and non-selectable support components) in the same machine 10. In particular, part and/or relationship databases 30, 32 may contain a listing of components that must be modified in some way based on a particular component or module selection made by the customer. For example, for a given selection of a fourth engine 16 within a first family of available engines, part and/or relationship database 30, 32 may have a listing of fifteen other components that must change in order to accommodate packaging of the selected engine 16. Likewise, for a selected combination of gas turbine module and compressor module (or engine 16 and compressor 18), part and/or relationship database 30, 32 may have a listing of fifty other support components associated with both modules that must be changed in order to generate the machine design.

Further, relationship database 32 may contain tables, formulas, equations, algorithms, etc. regarding how the critical dimensions of selectable components affect dimensions of the other components contained within the listings. For example, for a selection of the fourth engine 16 within the first family of available engines described above, relationship database 32 may indicate how each of the other components must stretch, shrink, rotate, move, etc, based on the particular selection. In particular, for the engine selection described above and with a corresponding critical engine length and width listed in relationship database 32, a new platform 20 may need to be created having side and end beams 44, 46 that increase in length from base lengths $L_3$, $L_4$ (respectively—referring to FIG. 3) to new lengths ($L_3$+f(selected engine length)) and ($L_4$+f(selected engine width)). Similarly, one or more new conduits within fluid circuits 36 may need to be created to accommodate the change in length of the new platform 20, for example to have a new length of ($L6$+f($L3$+f(selected engine length))). Other similar relationships may be contained within relationship database 32.

Relationship database 32, in some embodiments, may further contain information relating the location and/or orientation of one component relative to another within a module assembly. For example, the information may relate the coordinate axis described above that are associated with a particular engine 16 selected by the customer with the coordinate axis of a particular conduit within fluid circuitry 36 that has been modified to match the selected engine 16. As will be described in more detail below, this information may aid the assembly of gas turbine and/or compressor modules within the computer aided drafting environment.

It should be noted that a different number and/or different types of databases may be included within system 24, if desired. For example, part database 30 and relationship database 32 may be broken into multiple different databases or, alternatively, combined within a single database. It is further contemplated that the information described above as being stored in the different databases may additionally or alternatively be stored within the memory of processor(s) 26 or elsewhere on network 28, if desired.

Processor(s) 26 may be configured to receive module and/or component selections from a customer or other user of system 24, e.g. by way of a graphics user interface (GUI) associated with display 34 and/or one or more input devices 58, and automatically generate new designs of machine 10. In particular, processor(s) 26 may be configured to retrieve critical dimensions from part database 30 associated with the selected modules and/or components, and relationship information for the other components within the same module(s) from relationship database 32. Processor(s) 26 may then determine if designs for the other components already exist and, when they do not exist, generate new designs based on the critical dimensions and relationship information.

In some embodiments, new design generation may include solid modeling of the individual components and assembly of the components into the associated modules within the computer aided drafting environment described above. Processor(s) 26 may further be configured to store data relating to the new component and/or assembly designs under unique identifiers, create manufacturing and/or assembly drawings based on the new designs, analyze the new designs for performance, stress, strain, longevity, or another predefined criteria, and/or automatically control manufacturing or assembly equipment to produce and/or test the new components.

Figure 6:
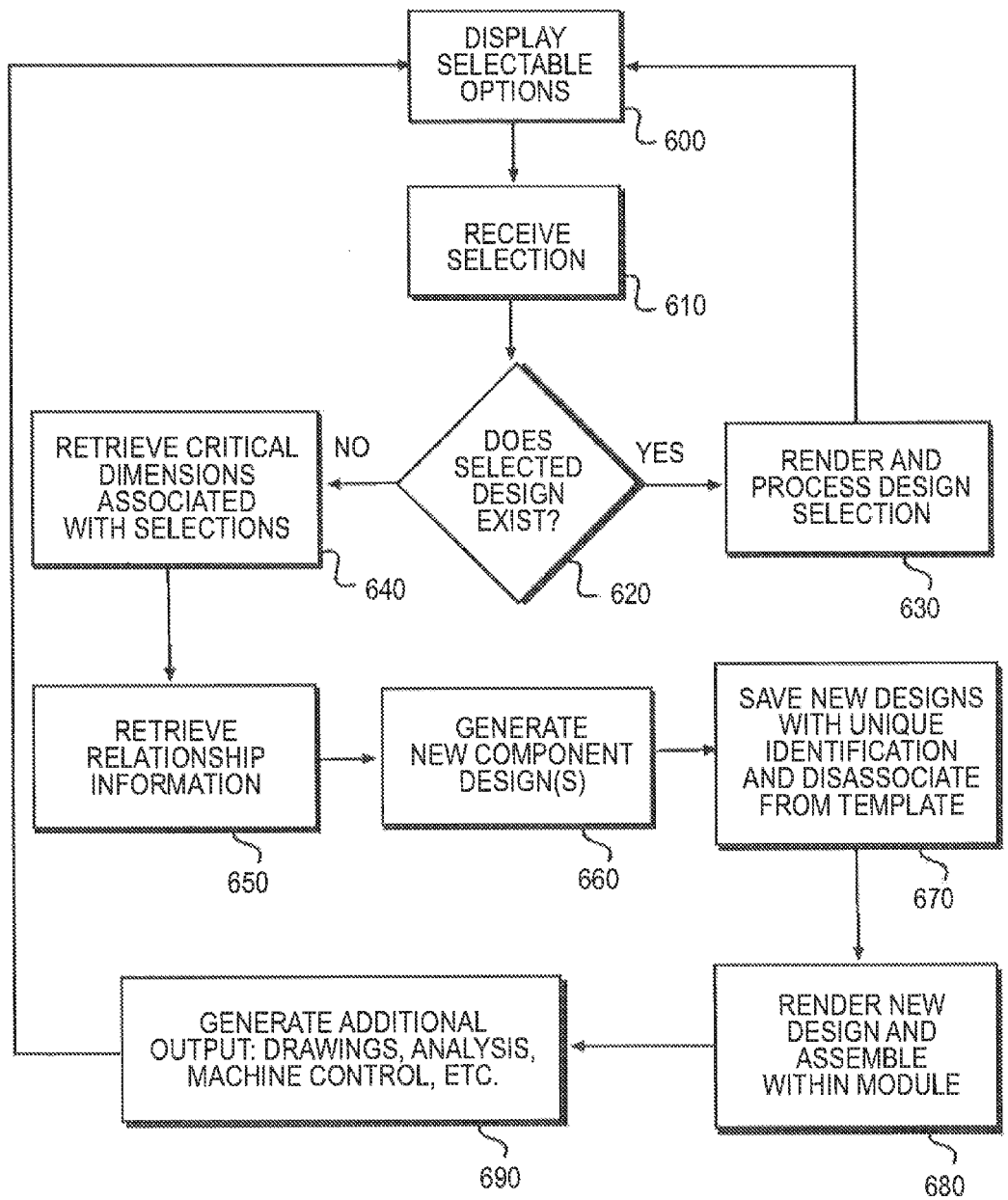
FIG. 6 is a flowchart depicting an exemplary disclosed method implemented by the design system of FIG. 2.

FIG. 6 illustrates an exemplary automated design process that may be performed by system 24. FIG. 6 will be described in more detail below to further illustrate the disclosed concepts.

Figure 7:
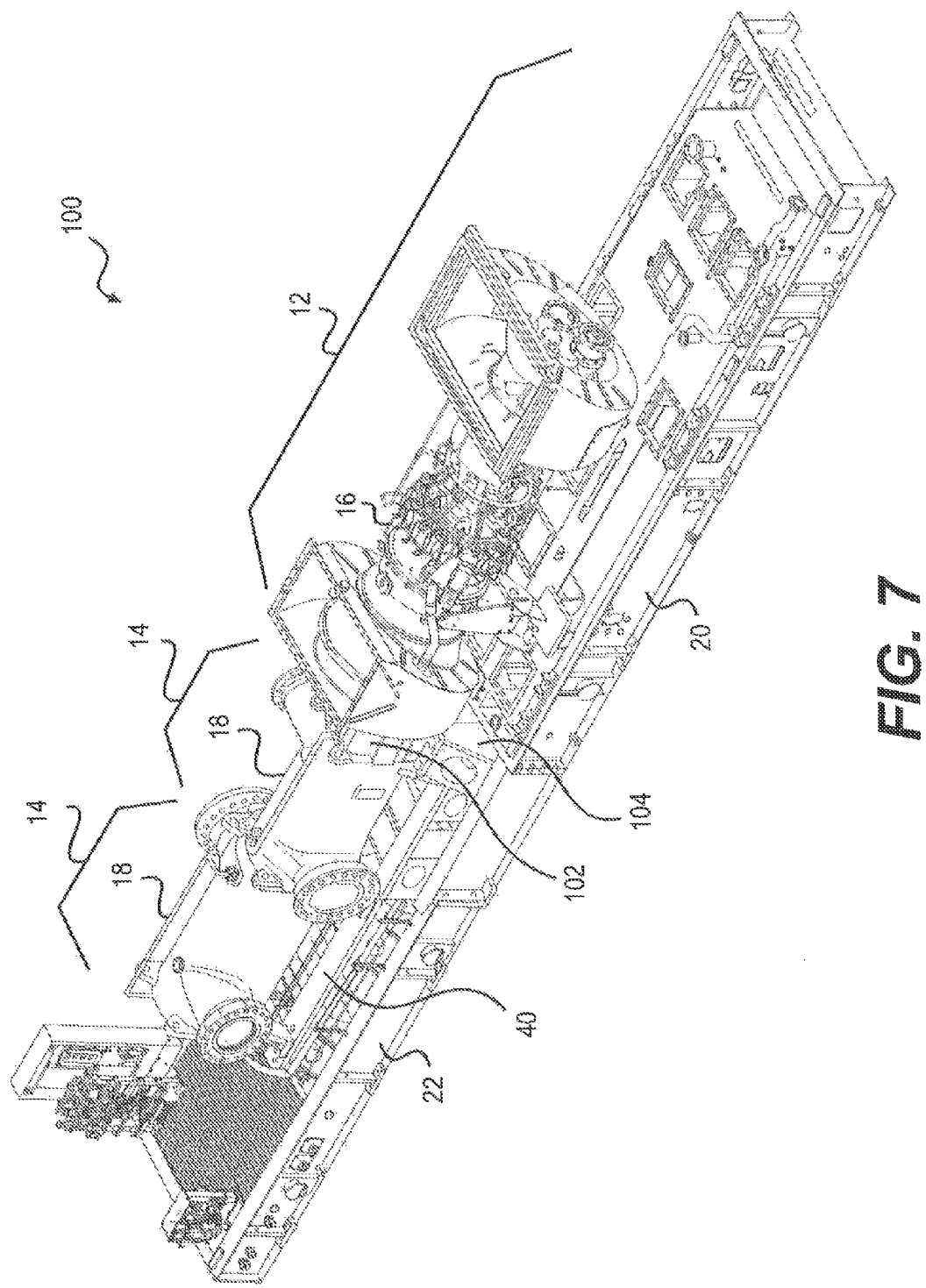
FIG. 7 is a perspective view illustration of an exemplary disclosed multi-body machine.

FIG. 7 illustrates another exemplary machine 100 that may be designed using system 24. Machine 100 of FIG. 7, like machine 10 of FIG. 1 may have input component 12. However, in contrast to machine 10, machine 100 may have multiple output components 14, which are operatively coupled to input component 12 (e.g., by way of a gear box 102 or a direct coupling). In the disclosed embodiment, input component 12 is a gas turbine module and both of output components 14 are together considered a multi-body compressor module connectable to be driven by the gas turbine module. Gear box 102 may function to connect a rotational output of the gas turbine module to an input of the multi-body compressor module. In one example, gear box 102 may simply be configured to split the rotational output between output components 14 of the multi-body compressor module. In another embodiment, gear box 102 may be configured to direct the rotational output into an upstream one of output components 14, which then transmits a portion of the rotational output on to a downstream one of output components 14 (e.g., via a serial path). In either embodiment, gear box 102 may additionally function to adjust a speed-to-torque ratio of the output before transfer of the output to the multi-body compressor module. For example, gear box 102 may function as a speed reducer (or increaser)/torque increaser (or reducer). It is contemplated that the gas turbine module may be packaged and sold independent of the multi-body compressor module and/or gear box 102 or, alternatively, packaged and sold together with the multi-body compressor module and gear box 102 as a single machine 100.

Gear box 102, like output components 14 of the multi-body compressor module, may also be mounted to its own platform 104, and further include all support components necessary to facilitate its operation. For example, gear box 102 may include all the hardware required to mechanically connect gear box 102 to platform 104. Gear box 102 may be packaged and sold together with either one of the gas turbine and compressor modules as part of the particular module or as a single machine with both modules.

The depicted gear box 102 may be representative of a variety of available gear boxes 102 that are selectable by the customer (and/or manufacturer) for inclusion within a particular machine 100. For example, the customer (and/or manufacturer) may select for packaging and purchasing any number of gear boxes 102 that differ in a variety of ways. The different gear boxes 102 may range in size, speed, power, noise, cost, and in other ways known in the art. Each gear box 102 may include a different housing, a different gear train, different connection interfaces, a different platform 104, a different lubrication system, a different cooling system, and/or different hardware that connects the components of gear box 102 to the gas turbine and compressor modules.

The depicted multi-body compressor module may be representative of a variety of available multi-body compressor modules that are selectable by the customer (and/or manufacturer) for inclusion within a particular machine 100. For example, the customer and/or manufacturer) may select for packaging and purchasing any number of multi-body compressor modules that differ in a variety of ways. The different multi-body compressor modules may range in number of compressors 18, types, sizes, speeds, power, noise, cost, and in other ways known in the art. Each multi-body compressor module may include a different compressor 18, a different gear box 102, a different platform 22 and/or 104, a different lubrication system, a different cooling system, a different induction system, a different discharge system, and/or different hardware that connects the components of the module together.

In some applications, the customer may be able to select any existing gas turbine module for connection to any existing or new multi-body compressor module by way of any gear box 102. In other applications, the customer (and/or manufacturer) may be able to select particular components within one or both of the gas turbine and multi-body compressor modules. For example, the customer (and/or manufacturer) may be able to select a particular gas turbine engine 16; particular compressors 18; particular gear boxes 102; a particular fuel system; particular platforms 20, 22, 104; or another particular component or system within one or both of the gas turbine and multi-body compressor modules. In some situations, the configuration of components selected by the customer (and/or manufacturer) may have already been designed and compiled within an existing module and, thus, ready for manufacture. In other situations, however, the configuration of components selected by the customer (and/or manufacturer) may be new. In these situations, design work may be required before the gas turbine and/or multi-body compressor modules are made available for purchase by the customer.

Figure 8:
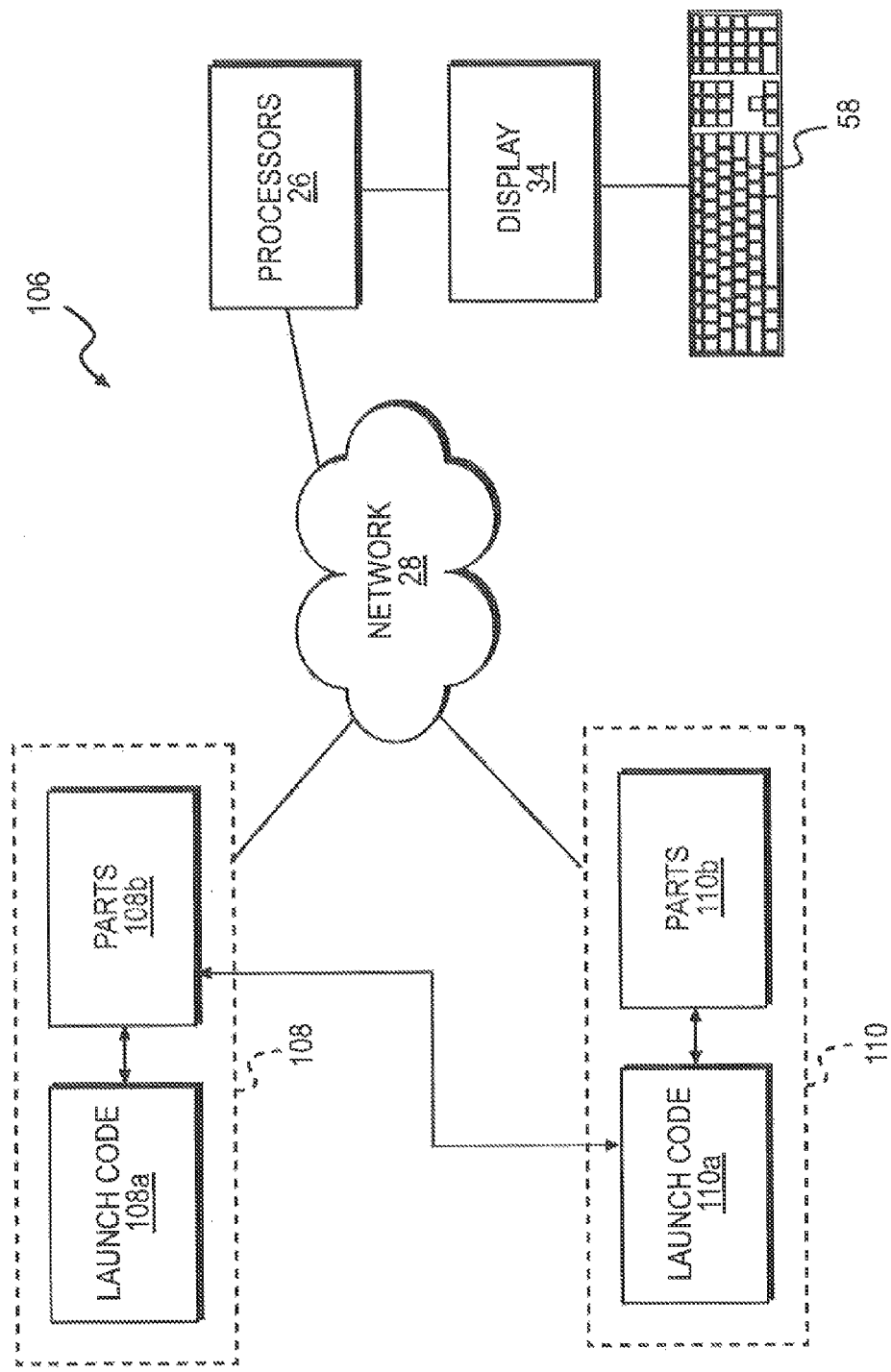
FIG. 8 is a diagrammatic illustration of another exemplary disclosed design system that may be used to automatically design the machine of FIG. 7.

FIG. 8 illustrates an exemplary disclosed system 106 used to automatically generate designs for the gas turbine and/or multi-body compressor modules having new configurations selected by the customer (and/or manufacturer). System 106 of FIG. 8, like system 24 of FIG. 2, may include one or more computer processors (or other hardware) 26 connected via network 28 to one or more databases. In contrast to system 24, system 106 may include additional and/or different databases. These databases may include, among others, a single-body database 108 and a multi-body database 110. Each of these databases may be subdivided between a launch code section 108*a*, 110*a* and a parts section 108*b*, 110*b*. Parts sections 108*b*, 110*b* of databases 108, 110 may function similar to parts database 30 of system 24, while launch code sections 108*a*, 110*a* may function similar to relationship database 32. Launch code section 108*a* may communicate with parts section 108*b*, while launch code section 110*a* may communicate with both parts sections 108*b* and 110*b*.

Launch code sections 108*a*, 110*a* may further contain information relating to modeling reference points associated with each fixed and/or each modifiable component within the gas turbine and multi-body compressor modules and/or gear box 102. For example, launch code sections 108*a*, 110*a* may each contain listings associated with each component that define a coordinate frame location and orientation, a required number and placement of reference datum planes and axis, directional information, etc. These listings may be built off of the capabilities of parts sections 108*b* and 110*b*. For example, parts section 108*b* may provide a foundation of modeling reference points associated with each fixed and/or modifiable component within the gas turbine and compressor modules, and launch code 108*a* may use this foundation during creation of single-body modules. In this same example, parts section 110*b* may build from parts section 108*b*, and launch code 108*b* may use this built-up foundation during creation of multi-body modules within the computer aided drafting environment.

INDUSTRIAL APPLICABILITY

The disclosed systems may be used to automatically design new components and assemblies of machine 10 and machine 100 based on customer (and/or manufacturer) component selections. The automated design process may be used to generate new configurations of machine 10 and machine 100 with reduced man hours and associated cost. Operation of systems 24 and 106 will now be described in detail with reference to FIG. 6.

In an exemplary embodiment, processor(s) 26 may cause customer (and/or manufacturer) selectable options to be shown on display 34 (Step 600). The options may be displayed in the form of drop down menus that list the different families of available engines 16, compressors 18, and/or gear boxes 102, along with other associated specifications (e.g., certification requirements, sealing requirements, etc.). From this GUI, the customer (and/or manufacturer) may select a specific combination of components and/or specifications for use in assembling machine 10 and/or machine 100, and processor(s) 26 may receive this selection (Step 610).

Based on the combination of components selected by the customer, processor(s) 26 may determine if the selected design of machine 10 and/or machine 100 already exists (Step 620). If the selected design does exist (Step 620:Yes), processor(s) 26 may render the existing design (Step 630), and control may return to step 600. It is contemplated that other or additional control options may be available to the customer or user at step 630, if desired. For example, the customer or user may be able to print the rendered design, pull up associated manufacturing and/or assembly drawings, generate a variety of different component and/or assembly analysis, etc.

When, however, at step 620, processor(s) 26 determines that the combination of components selected by the customer or user does not currently exist (Step 620: No), processor(s) 26 may retrieve critical dimensions associated with the selection. In particular, processor(s) 26 may communicate with part database 30 (or parts sections 108b and/or 110b of single-body database 108 and multi-body database 120) to obtain a list of critical dimensions associated with the selected components (Step 640). In some embodiments, processor(s) 26 may also communicate with these same databases and/or sections to obtain modeling information associated with the selected components.

Following step 640, processor(s) 26 may retrieve relationship information associated with the selected components (Step 650). As described above, this information may include a listing of other components affected by the customer's selection and information relating how these components may be affected (e.g., how particular dimensions of a support component may be affected by a change to a particular dimension in a customer selected component). This information may be stored within any database or section, as desired.

After receiving the relationship information, processor(s) 26 may manipulate the information to generate new designs for each of the components affected by the customer's (and/or manufacturer's) selection, as well as new assembly designs for the corresponding gas turbine and/or compressor modules (Step 660). Generation of the new designs may include retrieving a generic template for each affected component from within a computer aided drafting environment, selecting particular dimensions of the template, and modifying those dimensions. The newly modified design may then be disassociated from the generic template, assigned a unique identifier, and saved within the appropriate part database and/or section (Step 670). Processor(s) 26 may then render the new component(s) within the computer aided drafting environment, and assemble the component(s) within the appropriate module and/or machine 10 or machine 100 based on the coordinate frame location and orientation, required number and placement of reference datum planes and axis, directional information, etc. stored within relationship database 32 (or launch code sections 108a and/or 110a) (Step 680). In some embodiments, processor(s) 26 may again assign a unique identifier to the completed assembly, and save the assembly within part database 32 (or parts sections 108b and/or 110b).

After component and/or assembly generation, processor(s) 26 may be further configured to automatically generate additional output (Step 690), before returning to step 600. This output may include, among other things, generation of manufacturing and/or assembly drawings based on the newly generated designs, analysis of the rendered models, automated machine control to produce and/or other assembly the components, and other output known in the art.

It will be apparent to those skilled in the art that various modifications and variations can be made to the methods and systems described above. Other embodiments will be apparent to those skilled in the art from consideration of the specification and practice of the disclosed methods and systems. It is intended that the specification and examples be considered as exemplary only, with a true scope being indicated by the following claims and their equivalents.

What is claimed is:

1. A system for automated design of a machine having at least one driven body, the system comprising:
   at least one of a single-body database and a multi-body database having at least one of a part database and a relationship database;
   a display device;
   an input device; and
   one or more processors in communication with the at least one of a single-body database and a multi-body database, the display device, and the input device, the one or more processors being configured to:
      cause a listing of components selectable by a customer for inclusion within a machine to be shown on the display device;
      receive a selection of an input component and the at least one driven body from the listing by the customer via the input device;
      retrieve data regarding the selected input component and the at least one driven body from the at least one of the part database and the relationship database, wherein the data includes a list of critical dimensions associated with the selected input component and the at least one driven body, and relationship information regarding how the input component or the at least one driven body should change based on the list of critical dimensions; and
      generate a design to at least one new support component in the machine based on the input component, the at least one driven body, and the data.

2. The system of claim 1, wherein:
   the input component includes a gas turbine engine; and
   the at least one driven body includes a compressor that is connectable to be driven by the gas turbine engine.

3. The system of claim 2, wherein the at least one driven body further includes a gear box connecting the gas turbine engine to the different compressors.

4. The system of claim 3, wherein the at least one new support component includes at least one of a platform beam, a pedestal, a grating group, and fluid circuitry.

5. The system of claim 1, wherein the data further includes computer aided drafting data associated with at least one of a coordinate frame location and orientation, a required number and placement of reference datum planes and axis, and directional information for the input component, the at least one driven body, and the at least one new support component.

6. The system of claim 1, wherein the one or more processors is further configured to render the design for the at least one new support component within a computer aided drafting environment.

7. The system of claim 6, wherein the one or more processors is further configured to:
   disassociate the design for the at least one new support component from a generic template used to generate the design;
   assign a unique identifier to the design; and
   save the design within the at least one of the part database and the relationship database.

8. The system of claim 7, wherein the one or more processors is further configured to assemble the input component, the at least one driven body, and the at least one new support component within the computer aided drafting environment.

9. The system of claim 8, wherein the one or more processors is further configured to generate at least one of a drawing and an analysis of the at least one new support component after the design is complete.

10. A method for automatically designing a machine having at least one driven body, comprising:
displaying, using a display device, a listing of components selectable for inclusion within a machine;
receiving, at a processor, a selection of an input component and the at least one driven body from the listing;
retrieving, using the processor, data regarding the input component and the at least one driven body from at least one of a single-body database and a multi-body database having at least one of a part database and a relationship database, wherein the data includes a list of critical dimensions associated with the selected input component and the at least one driven body, and relationship information regarding how the input component or the at least one driven body should change based on the list of critical dimensions; and
automatically generating, using the processor, a design to at least one new support component in the machine based on the input component, the at least one driven body, and the data.

11. The method of claim 10, wherein:
the input component includes a gas turbine engine; and
the at least one driven body includes a compressor that is connectable to be driven by the gas turbine engine.

12. The method of claim 11, wherein the at least one new support component includes at least one of a platform beam, a pedestal, a grating group, and fluid circuitry.

13. The method of claim 10, wherein the data further includes computer aided drafting data associated with at least one of a coordinate frame location and orientation, a required number and placement of reference datum planes and axis, and directional information for the input component, the at least one driven body, and the at least one new support component.

14. The method of claim 10, further including rendering the design for the at least one new support component within a computer aided drafting environment.

15. The method of claim 14, further including:
disassociating the design for the at least one new support component from a generic template used to generate the design;
assigning a unique identifier to the design; and
saving the design within the at least one of the part database and the relationship database.

16. The method of claim 15, further including assembling the input component, the at least one driven body, and the at least one new support component within the computer aided drafting environment.

17. The method of claim 16, further including generating at least one of a drawing and an analysis of the at least one new support component after the design is complete.

18. The new support component having a design automatically generated using the method of claim 10.

19. A machine automatically designed using the method of claim 16, the machine being an assembly including the new support component.

20. A non-transitory computer readable medium for use on at least one computer system containing computer-executable programming instructions for performing a method of automated machine design, the method comprising:
displaying a listing of components selectable for inclusion within a machine;
receiving a selection of an input component and at least one driven body from the listing;
retrieving data regarding the input component and the at least one driven body from at least one of a single-body database and a multi-body database having at least one of a part database and a relationship database, wherein the data includes a list of critical dimensions associated with the selected input component and at least one driven body, and relationship information regarding how the input component or the at least one driven body should change based on the list of critical dimensions; and
automatically generating a design to at least one new support component in the machine based on the input component, the at least one driven body, and the data;
disassociating the design for the at least one new support component from a generic template used to generate the design;
assigning a unique identifier to the design;
saving the design; and
rendering the design for the at least one new support component within a computer aided drafting environment.

21. The non-transitory computer readable medium of claim 20, wherein:
the input component is a gas turbine engine;
the at least one driven body includes a compressor connectable to be driven by the gas turbine engine; and
the at least one new support component includes at least one of a platform beam, pedestal, a grating group, and fluid circuitry.

22. The non-transitory computer readable medium of claim 20, further including retrieving computer aided drafting data associated with at least one of a coordinate frame location and orientation, a required number and placement of reference datum planes and axis, and directional information for the at least one of the selected components and the at least one new support component.

* * * * *